(12) United States Patent
Koga

(10) Patent No.: US 7,957,157 B2
(45) Date of Patent: Jun. 7, 2011

(54) PRINTED CIRCUIT BOARD

(75) Inventor: Yuuichi Koga, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/714,275

(22) Filed: Feb. 26, 2010

(65) Prior Publication Data

US 2010/0220454 A1   Sep. 2, 2010

(30) Foreign Application Priority Data

Feb. 27, 2009  (JP) ................................. 2009-046798

(51) Int. Cl.
   *H05K 7/18* (2006.01)
(52) U.S. Cl. ........ 361/800; 361/760; 174/255; 174/259; 174/260; 174/261; 174/262; 257/99; 257/678; 257/693; 257/698; 257/734; 257/738; 438/114; 438/127; 29/832
(58) Field of Classification Search .................. 361/800, 361/760; 174/255, 259, 260–262; 257/99, 257/678, 693, 698, 734, 738; 438/114, 127; 29/832
See application file for complete search history.

(56) References Cited

U.S. PATENT DOCUMENTS

2008/0224309 A1   9/2008  Hori

FOREIGN PATENT DOCUMENTS

| JP | 10-093297 | | 4/1998 |
|---|---|---|---|
| JP | 10-093297 | A | 4/1998 |
| JP | 11-177223 | A | 7/1999 |
| JP | 2005-347710 | A | 12/2005 |
| JP | 2006-278946 | | 10/2006 |
| JP | 2006-278946 | A | 10/2006 |
| JP | 2008-060162 | A | 3/2008 |
| JP | 2008-226946 | | 9/2008 |
| JP | 2008-226946 | A | 9/2008 |

OTHER PUBLICATIONS

Notice of Reasons for Rejection mailed by Japan Patent Office on Jul. 13, 2010 in the corresponding Japanese patent application No. 2009-046798.

*Primary Examiner* — Xiaoliang Chen

(74) *Attorney, Agent, or Firm* — Knobbe, Martens Olson & Bear LLP

(57) ABSTRACT

A printed circuit board including: a semiconductor package; a board; first to fourth electrodes on a second face of the semiconductor package; fifth to eighth electrodes on a mount region of the board; a first conductor connecting the first electrode with the second electrode; a second conductor connecting the third electrode with the fourth electrode; a third conductor connecting the sixth electrode with the seventh electrode; fourth conductors respectively connecting to the fifth electrode and the eighth electrode; conductive bonding portions bonding each of the electrodes on the second face with corresponding one of the electrodes on the mount region; and a determination circuit connected to the fourth conductors and configured to determine a difference between a value of current supplied to one of the fourth conductors and a value of current received through the other fourth conductor.

9 Claims, 14 Drawing Sheets

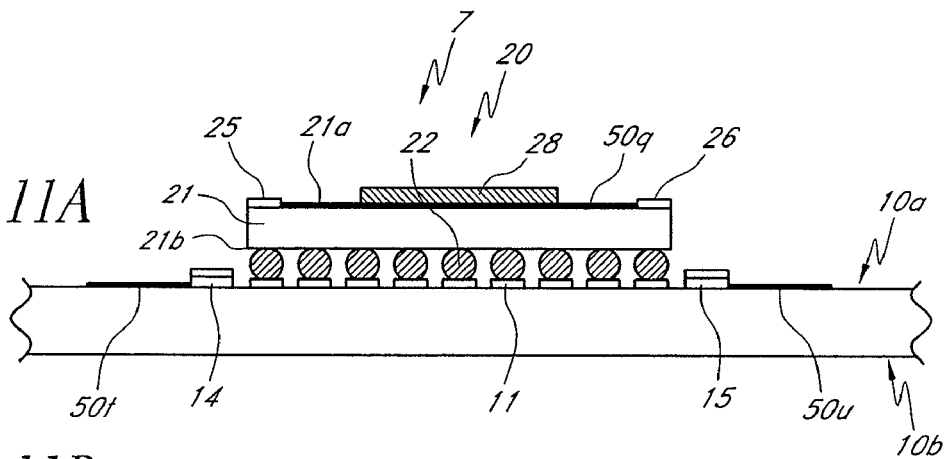
FIG. 11A
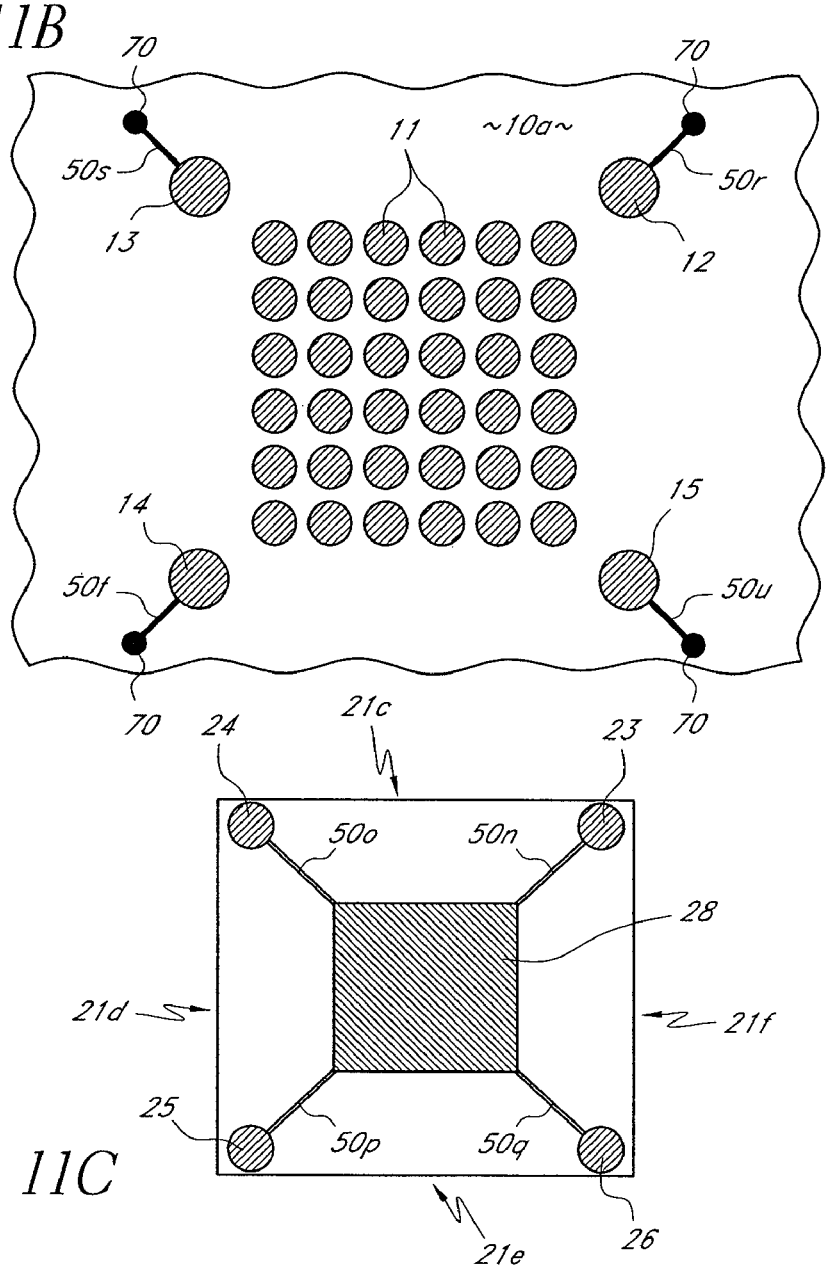
FIG. 11B
FIG. 11C

PRINTED CIRCUIT BOARD

CROSS-REFERENCE TO RELATED APPLICATIONS

This application is based upon and claims the benefit of priority from Japanese Patent Application No. 2009-046798, filed on Feb. 27, 2009, the entire contents of which are incorporated herein by reference.

BACKGROUND

1. Field

An aspect of the present invention relates to a printed circuit board having a semiconductor package and a board bonded by bonding portions.

2. Description of the Related Art

Among printed circuit boards for use in portable computers, there are some printed circuit boards mounted with semiconductor packages called Ball Grid Arrays (BGAs). In the BGA, solder balls are arrayed like a grid in a lower face of a semiconductor package, and each solder ball is connected to an electrode on a board. In order to monitor the mounting condition of the solder balls, the mounting condition is determined in some printed circuit boards using electrodes located in the four outermost circumferential corners of a region where the solder balls are mounted on the board. That is, a given test signal is supplied from a signal circuit to an electrode located in one of the four outermost circumferential corners, and the test signal is received from another electrode located in another of the four outermost circumferential corners through a pattern connecting the electrodes located in the four outermost circumferential corners. Based on the received test signal, a determination circuit determines whether soldering is poor or not in the electrodes located in the four outermost circumferential corners (see JP-A-2006-278946, for instance).

In some kind of BGA board, a semiconductor package is connected to the board through a plurality of solder balls, but another structure for fixing the semiconductor package to the board is also used in addition to the solder balls in order to ensure the reliability of the connection. For example, corner portions of the semiconductor package may be fixed to the board through bonding portions made of resin.

Stress is usually imposed on the BGA from the outside. Therefore, the bonding portions applied to the outer circumference of the BGA will be separated before the BGA is separated. When separation of the bonding portions is found out in the case where a semiconductor package is bonded by use of the bonding portions, separation of solder balls connecting the BGA to the board can be therefore known beforehand in an earlier stage.

BRIEF DESCRIPTION OF THE SEVERAL VIEWS OF THE DRAWINGS

A general architecture that implements the various feature of the present invention will now be described with reference to the drawings. The drawings and the associated descriptions are provided to illustrate embodiments of the present invention and not to limit the scope of the present invention.

FIGS. 11A to 11C are exemplary schematic views of a printed circuit board according to a third embodiment of the invention;

DETAILED DESCRIPTION

Various embodiments according to the present invention will be described hereinafter with reference to the accompanying drawings. In general, according to one embodiment of the present invention, there is provided a printed circuit board comprising: a semiconductor package comprising a substantially rectangular parallelepiped body, a first face configured to be provided with a plurality of solder balls, and a second face located on an opposite side to the first face; a board configured to mount the semiconductor package so that the plurality of solder balls are interposed between the semiconductor package and the board, and comprising a mount region facing the first face and corresponding to the first face; first, second, third and fourth electrodes respectively provided on four corners of an outer circumference of the second face; fifth, sixth, seventh and eighth electrodes provided on an outer circumference of the mount region correspondingly to the first to fourth electrodes respectively; a first conductor mounted on the second face and connecting the first electrode with the second electrode; a second conductor mounted on the second face and connecting the third electrode with the fourth electrode; a third conductor mounted on the outer circumference of the mount region and connecting the sixth electrode with the seventh electrode; a pair of fourth conductors mounted on the outer circumference of the mount region and respectively connecting to the fifth electrode and the eighth electrode; conductive bonding portions applied to the four corners of the semiconductor package and bonding each of the electrodes on the second face with corresponding one of the electrodes on the mount region; and a determination circuit connected to the pair of fourth conductors and configured to determine whether or not there is a difference between a value of current supplied to one of the fourth conductors and a value of current received through the other fourth conductor.

Exemplary embodiments of the invention will be described below with reference to FIG. 1 to FIG. 14H. Each of the embodiments of the invention will be described in the case where a printed circuit board 7 according to the embodiment has been applied to a portable computer 1 as an electronic apparatus, by way of example.

Figure 1:
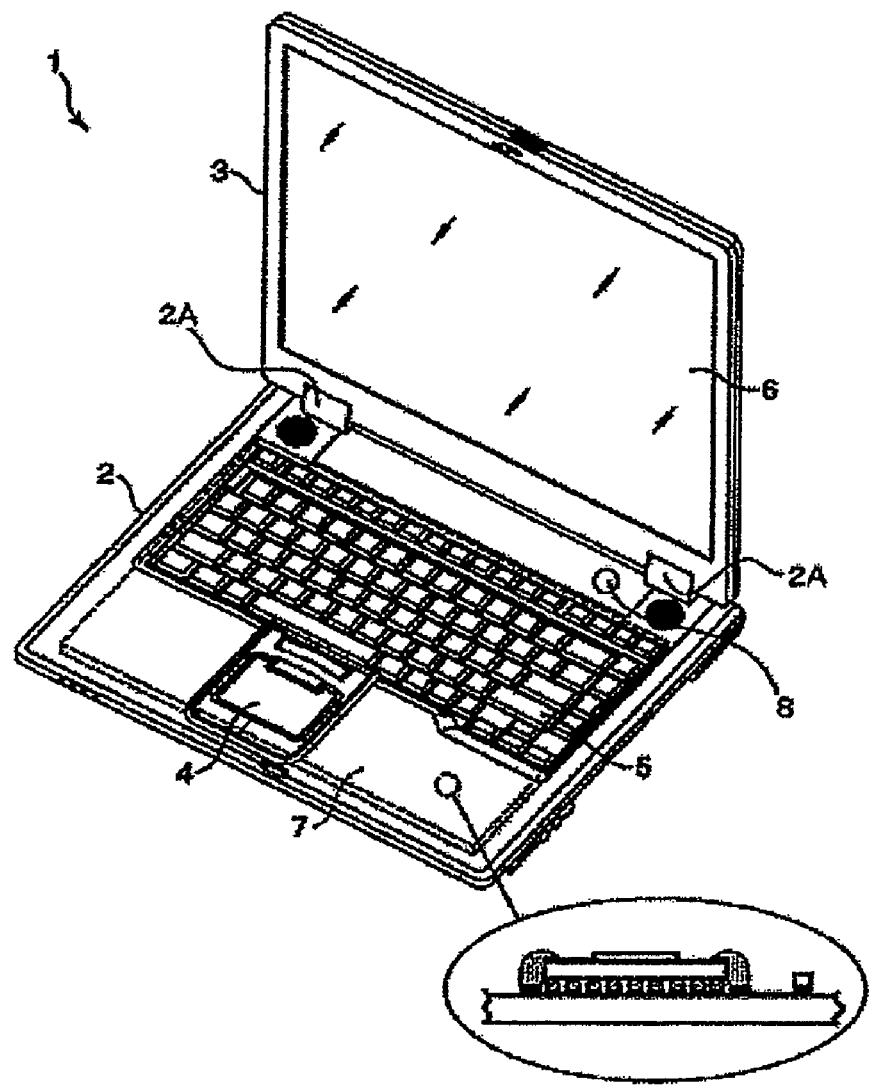
FIG. 1 is an exemplary perspective view of a portable computer according to an embodiment of the invention.

FIG. 1 is a perspective view of the portable computer 1 according to an embodiment of the invention. In FIG. 1, a display housing 3 is attached to a body 2 of the portable computer 1 through hinge mechanisms 2A so that the display housing 3 can rotate. Operating portions such as a touch pad 4, a keyboard 5, etc. are provided in the body 2. A display device such as a Liquid Crystal Display (LCD) is provided in the display housing 3.

A printed circuit board (mother board) 7 is also provided in the body 2. A control circuit for controlling the operating portions including the touch pad 4, the keyboard 5, etc. and the display device 6 have been incorporated into the printed circuit board 7.

Figure 2A:
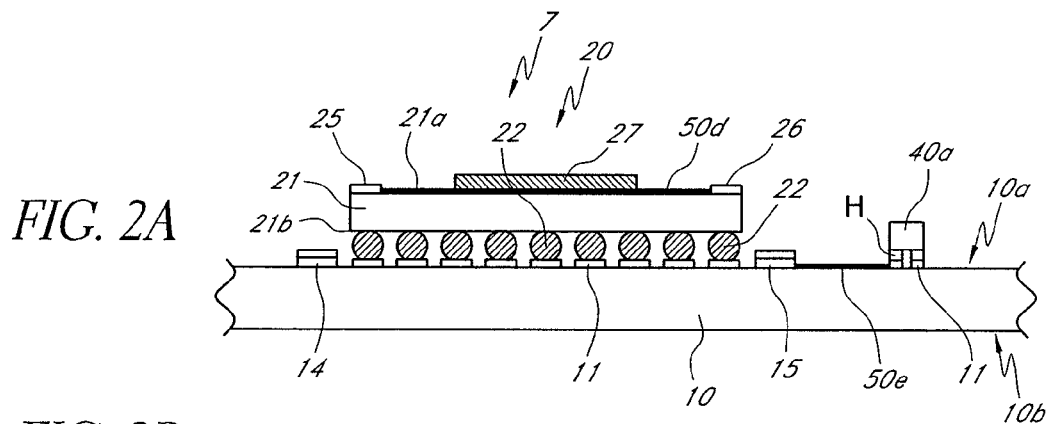
FIGS. 2A to 2C are exemplary schematic views of a printed circuit board according to a first embodiment of the invention.
Figure 2B:
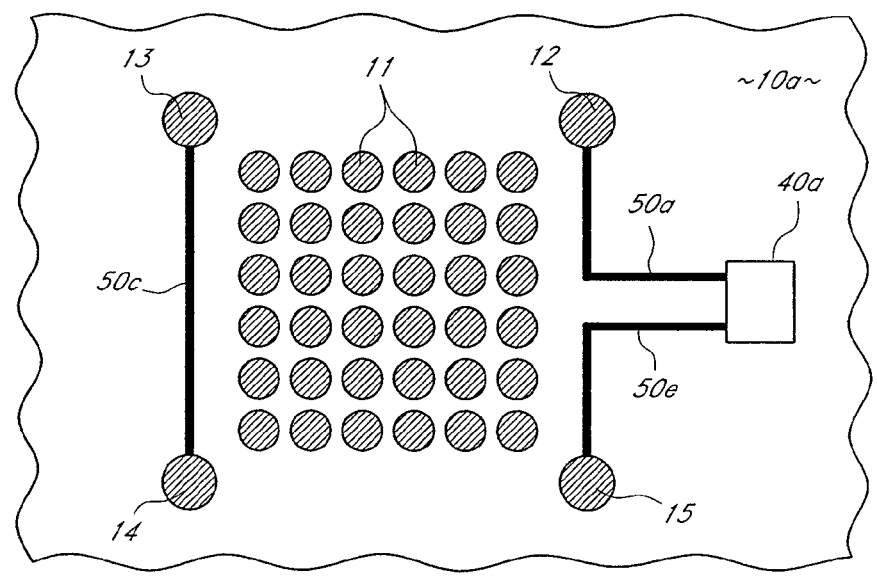
Figure 2C:
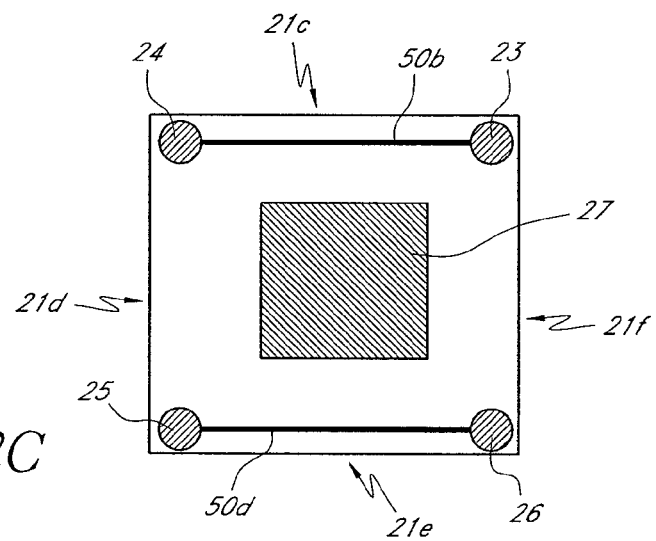
Figure 3A:
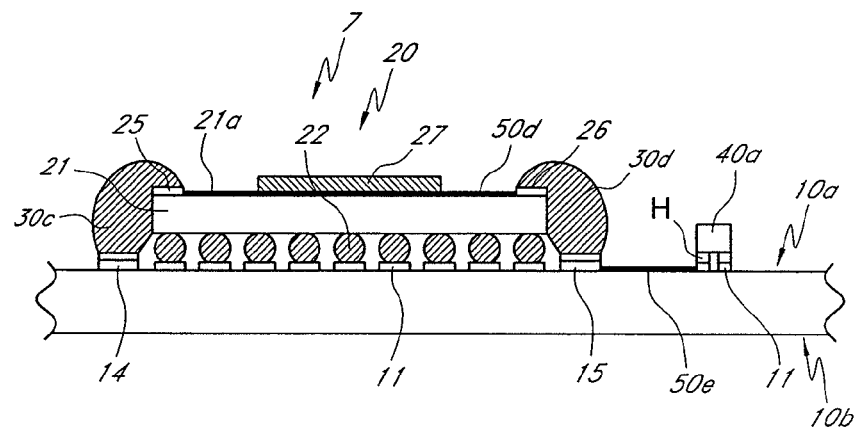
FIGS. 3A and 3B are exemplary schematic views of the printed circuit board according to the first embodiment of the invention, to which conductive bonding portions have been applied.
Figure 3B:
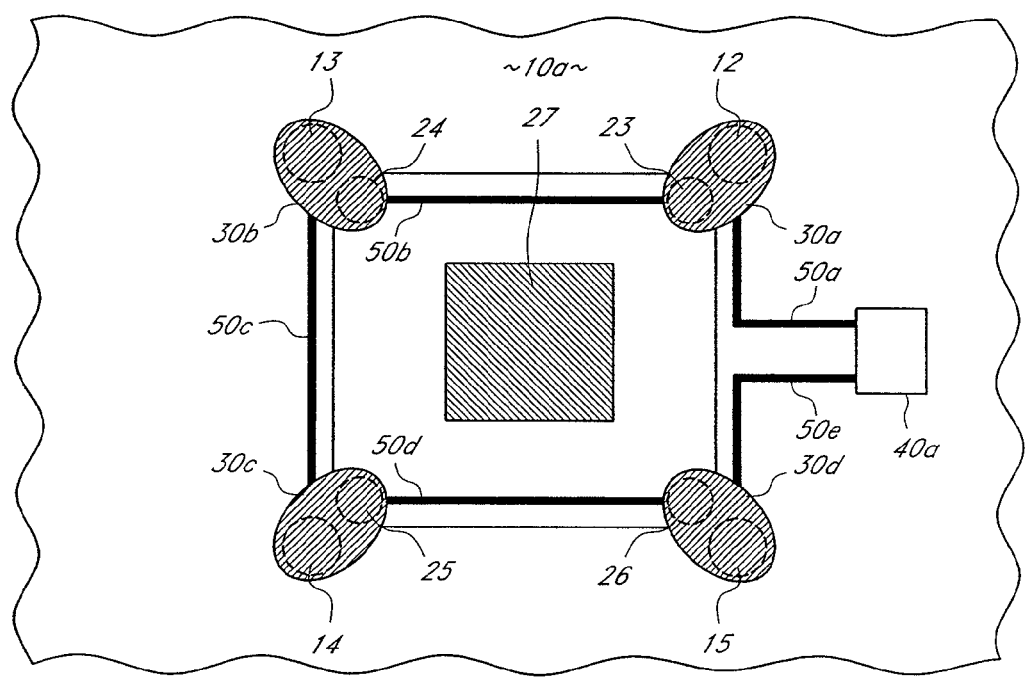

A first embodiment of the invention will be described with reference to FIG. 2A to FIG. 6F. First, the structure of a printed circuit board 7 will be described with reference to FIGS. 2A to 2C and FIGS. 3A and 3B. FIGS. 2A to 2C are schematic views of a printed circuit board 7 according to the first embodiment of the invention. FIG. 2A is a sectional view of the printed circuit board 7. FIG. 2B is a top view of a board 10. FIG. 2C is a top view of a semiconductor package 20. FIGS. 3A and 3B are schematic views of the printed circuit board 7 according to the first embodiment of the invention, to which conductive bonding portions 30a to 30d have been applied. FIG. 3A is a sectional view of the printed circuit board 7 to which the conductive bonding portions 30a to 30d have been applied. FIG. 3B is a top view of the printed circuit board 7 to which the conductive bonding portions 30a to 30d have been applied.

First, the structure of the printed circuit board 7 to which the conductive bonding portions 30a to 30d have not yet been applied will be described. As shown in FIG. 2A, the printed circuit board 7 has a board 10, a semiconductor package 20, a determination circuit 40a and conductors 50a to 50e. That is, the board 10 mounted with the respective electronic components is referred to as the printed circuit board 7.

The board 10 has a first face 10a and a second face 10b. In the first face 10a of the board 10, a plurality of pads 11 are provided in regions opposed to solder balls 22 of the semiconductor package 20 which will be described later, and in regions where other electronic components will be mounted. Mount regions relevant to the invention correspond to the regions opposed to the solder balls 22 provided in the semiconductor package 20. Whether the board 10 is a single-layer board or a multi-layer board does not matter. The board 10 may have wirings or electrodes in the first face 10a or the second face 10b or in an inner layer if the board 10 is a multi-layer board. In addition, the first face 10a or the second face 10b may be coated with a solder resist.

The semiconductor package 20, for example, has a chip 27, a package body 21 with a substantially rectangular parallelepiped shape, and a plurality of solder balls 22 protruding from one face of the package body 21. That is, the package body 21 has an upper face 21a, a lower face 21b located on the opposite side to the upper face 21a, and side faces 21c, 21d, 21e and 21f surrounding the circumferences of the upper face 21a and the lower face 21b, so as to form a flat, substantially rectangular parallelepiped shape. The chip 27 is provided on the upper face 21a. The chip 27 is mounted on the package body 21 by a mounting method such as wire-bonding connection, tape automated bonding connection, flip-chip connection, or the like. The semiconductor package 20 is, for example, a Ball Grid Array (BGA) type semiconductor package, a Chip Sized Package (CSP) type semiconductor package, or the like.

In this embodiment, as shown in FIG. 2B, a detection pad 12, a detection pad 13, a detection pad 14 and a detection pad 15 are provided in the outer circumference of a set of pads 11 of the package body 21 to be mounted on the first face 10a of the board 10. On the other hand, as shown in FIG. 2C, a detection pad 23, a detection pad 24, a detection pad 25 and a detection pad 26 are provided on the upper face 21a of the package body 21.

The determination circuit 40a supplies a given detection signal to a circuit connected through the conductors 50a to 50e, and receives the detection signal through the detection pads, the conductive bonding portions, etc. The determination circuit 40a compares the received detection signal with the supplied given detection signal to determine separation of the conductive bonding portions 30a to 30d.

The conductors 50a to 50e connect a plurality of detection pads and the determination circuit 40a, and connect a circuit for finding out the separation of the conductive bonding portions 30a to 30d. As shown in FIG. 2B, the conductor 50a connects the determination circuit 40a and the detection pad 12, the conductor 50c connects the detection pad 13 and the detection pad 14, and the conductor 50e connects the detection pad 15 and the determination circuit 40a. As shown in FIG. 2C, the conductor 50b connects the detection pad 23 and the detection pad 24, and the conductor 50d connect the detection pad 25 and the detection pad 26.

Next, the structure of the printed circuit board 7 to which the conductive bonding portions 30a to 30d have been applied will be described with reference to FIGS. 3A and 3B. The conductive bonding portions 30a to 30d are members for bonding the package body 21 with the board 10. The conductive bonding portions 30a to 30d are conductive. For example, a filler containing carbon, silver or the like is used for the conductive bonding portions 30a to 30d. The conductive bonding portion 30a bonds the detection pad 12 and the detection pad 23, the conductive bonding portion 30b bonds the detection pad 13 and the detection pad 24, the conductive bonding portion 30c bonds the detection pad 14 and the detection pad 25, and the conductive bonding portion 30d bonds the detection pad 15 and the detection pad 26. Application of the conductive bonding portions 30a to 30d achieves connection between the corresponding detection pads provided in the respective corner portions of the package body 21. Thus, a circuit connected to the determination circuit 40a is formed. That is, the corner portions are bonded by the conductive bonding portions independently of one another. Thus, a circuit for transmitting a detection signal is formed while the board 10 and the semiconductor package 20 are bonded.

In addition, since the conductive bonding portions 30a to 30d are applied to the corner portions, damage to the package body 21 can be avoided during the heat treatment for bonding the solder balls 22 and the conductive bonding portions 30a to 30d. If a bonding portion is applied annularly all over the outer circumference of the package body 21, the air enclosed between the package body 21 and the board 10 will expand during the heat treatment to cause damage to the package body 21. It is therefore desired that the conductive bonding portions 30a to 30d are applied to the corner portions or the like so that the connection between the board and the semiconductor package can be kept.

Figure 4:
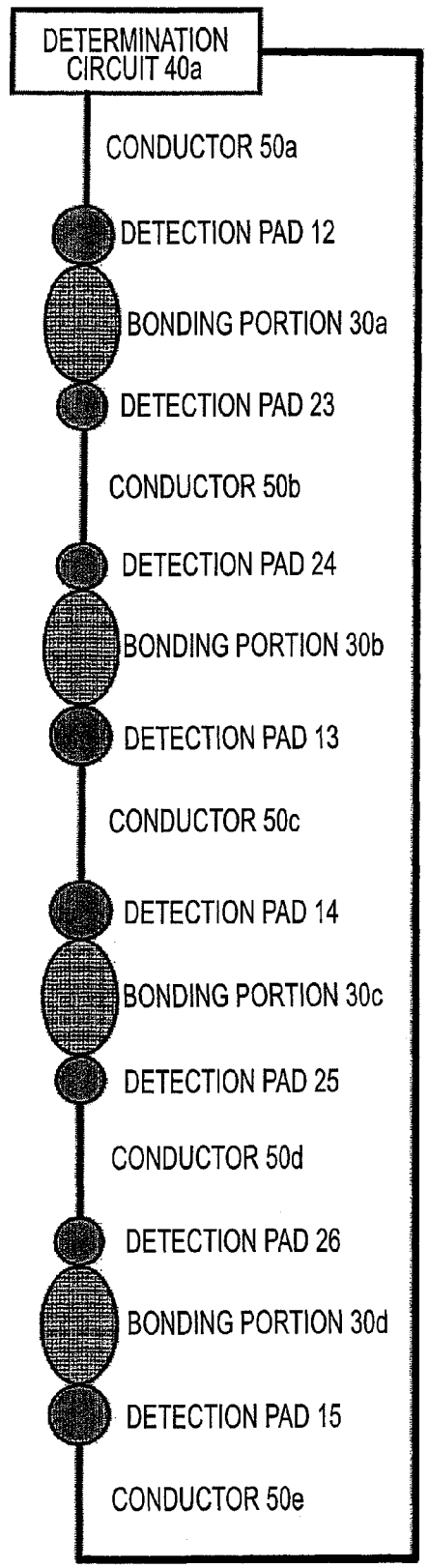
FIG. 4 is an exemplary conceptual view of connection of the printed circuit board according to the first embodiment of the invention.

The connection relationship in the printed circuit board 7 configured as described above will be described with reference to FIG. 4. FIG. 4 is a conceptual view of the connection of the printed circuit board 7 according to the first embodiment of the invention.

The detection pads 12 to 15, the detection pads 23 to 26, the conductive bonding portions 30a to 30d and the determination circuit 40a are connected through the conductors 50a to 50e. A test signal is supplied from the determination circuit 40a through the conductor 50a, the detection pad 12, the conductive bonding portion 30a and the detection pad 23 to the conductor 50b in this order. First, the test signal is transmitted to the detection pad 12 through the conductor 50a provided on the board 10. Thus, the test signal is transmitted to the detection pad 23 through the conductive bonding portion 30a. In this case, the test signal is transmitted from the board 10 onto the upper face 21a of the package body 21. That is, the conductive bonding portion 30a serves as a switch. When the conductive bonding portion 30a is not bonded, the separation of the conductive bonding portion 30a can be determined based on increase of the resistance value or the like. Next, the test signal is transmitted to the detection pad 24 through the conductor 50b provided on the upper face 21a of the package body 21. Then, the test signal is transmitted to the detection pad 13 on the board 10 through the conductive bonding portion 30b, so that it can be determined whether the conductive bonding portion 30b is bonded or not. In this case, the test signal is transmitted from the upper face 21a of the package body 21 onto the board 10. In this manner, the conductors 50a to 50e provided alternately on the board 10 and on the upper face 21a of the package body 21 are connected through the conductive bonding portions 30a to 30d so that the bonding condition of the conductive bonding portions 30a to 30d can be monitored.

Figure 5:
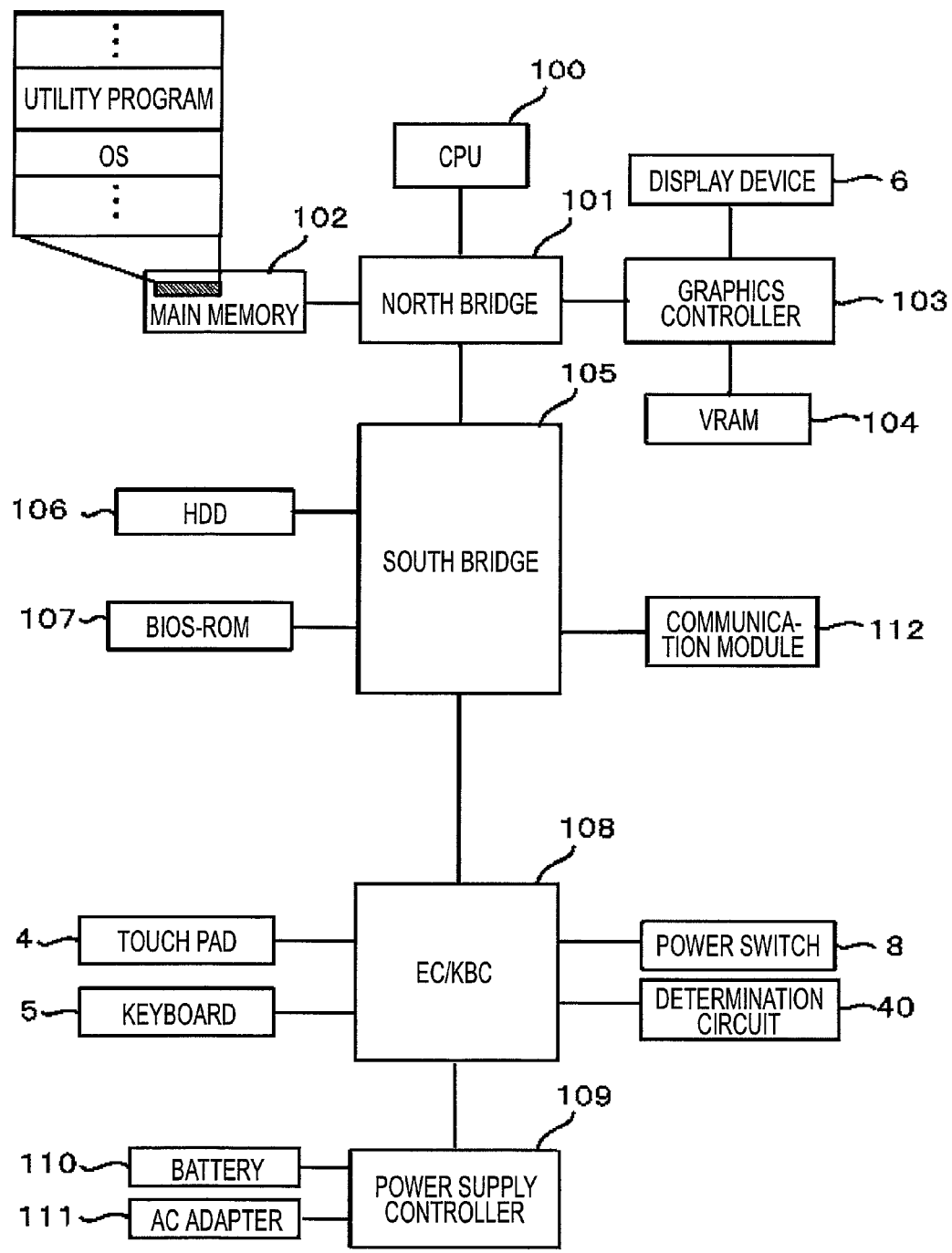
FIG. 5 is an exemplary functional block diagram of the portable computer according to the first embodiment of the invention.

FIG. 5 is a functional block diagram of the portable computer 1 according to the first embodiment of the invention. The portable computer 1 according to the first embodiment has a touch pad 4, a keyboard 5, a display device 6, a power switch 8, a determination circuit 40a, a Central Processing Unit (CPU) 100, a north bridge 101, a main memory 102, a graphics controller 103, a Video Random Access Memory (VRAM) 104, a south bridge 105, a Hard Disk Drive (HDD) 106, a Basic Input Output System Read Only Memory (BIOS-ROM) 107, an Embedded Controller/Keyboard Controller (EC/KBC) 108, a power supply controller 109, a battery 110, an AC adapter 111, and a communication module 112.

The touch pad 4 and the keyboard 5 are input devices for inputting various operating signals to the portable computer 1 in accordance with user's operation.

The display device 6 displays an image based on a video signal from the graphics controller 103.

The power switch 8 inputs a control signal for powering on/off the portable computer 1 in accordance with user's operation.

The determination circuit 40a determines the separation of the conductive bonding portions 30 applied to the circumference of the package body 21 and supplies a determination result to the EC/KBC 108. The supplied determination result is supplied to the display device 6 through the EC/KBC 108 to inform the user thereof.

The CPU 100 is a processor provided for controlling operation of the portable computer 1. The CPU 100 executes an operating system and various application programs loaded from the HDD 106 onto the main memory 102. The CPU 100 also loads a system BIOS stored in the BIOS-ROM 107 onto the main memory 102 and then executes the system BIOS. The system BIOS is a hardware control program.

The north bridge 101 is a bridge device through which a local bus of the CPU 100 is connected with the south bridge 105. The north bridge 101 also includes a memory controller for controlling access to the main memory 102. The north bridge 101 also has a function of executing communication with the graphics controller 103 through an Accelerated Graphics Port (AGP) bus or the like.

The main memory 102 is a so-called working memory for developing the operating system and the various application programs stored in the HDD 106 and the system BIOS stored in the BIOS-ROM 107.

The graphics controller 103 is a display controller for controlling the display device 6 used as a display monitor of the portable computer 1. From display data stored in the VRAM 104 by the operating system or the application programs, the graphics controller 103 generates a video signal for forming a display image to be displayed on the display device 6. The video signal generated by the graphics controller 103 is supplied to a line.

The south bridge 105 controls the access to the BIOS-ROM 107, and disk drives (I/O devices) such as the HDD 106, an Optical Disk Drive (ODD), etc. In this embodiment, the communication module 112 for performing wireless communication with external equipment is connected to the south bridge 105.

The HDD 106 is a storage unit for storing the operating system, various application programs, etc.

The BIOS-ROM 107 is a rewritable nonvolatile memory for storing the system BIOS which is a hardware control program.

The EC/KBC 108 controls the touch pad 4 and the keyboard 5 serving as input devices. The EC/KBC 108 is a one-chip microcomputer which detects and controls various devices (peripheral devices, sensors, power supply circuits, etc.) regardless of the system status of the portable computer 1. In addition, the EC/KBC 108 has a function of powering on/off the portable computer 1 in cooperation with the power supply controller 109 in accordance with a user's operation on the power switch 7.

When an external power is supplied to the power supply controller 109 through the AC adapter 111, the power supply controller 109 uses the external power supplied from the AC adapter 111 to generate a system power to be supplied to each component of the portable computer 1. When no external power is supplied to the power supply controller 109 through the AC adapter 111, the power supply controller 109 uses the battery 110 to generate a system power to be supplied to each component (body 2 and display device 6) of the portable computer 1.

The communication module 112 is a module for performing wireless communication with external equipment. The communication module 112 includes a wireless antenna, a wireless communication circuit, etc.

In the portable computer 1 configured as described above, a determination result in the determination circuit 40a is displayed on the display device 6. That is, when the separation of the conductive bonding portion 30a to 30d is found out by the determination circuit 40a, it is possible to notify the user of the necessity of maintenance.

Next, a method for manufacturing the printed circuit board according to the first embodiment will be described with reference to FIGS. 6A to 6F. FIGS. 6A to 6F are views showing the method for manufacturing the printed circuit board 7 according to the first embodiment of the invention.

Figure 6A:
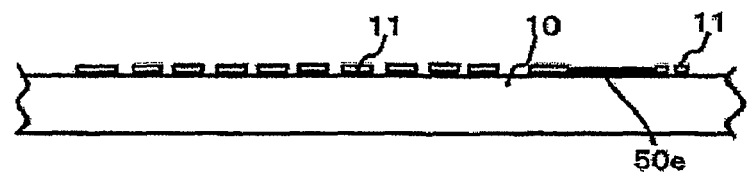
FIGS. 6A to 6F are exemplary views showing a method for manufacturing the printed circuit board according to the first embodiment of the invention.

First, as shown in FIG. 6A, a board 10 having a plurality of pads 11 on which a semiconductor package 20 and a determination circuit 40a will be mounted is prepared (wiring board preparation step, Step S1). Further, detection pads 12 to 15 and the pads 11 for mounting the determination circuit 40a thereon are connected respectively through conductors 50a, 50c and 50e on the board 10.

Figure 6B:
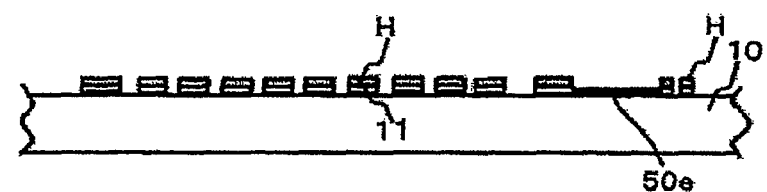

Next, as shown in FIG. 6B, solder paste H is applied to the pads 11 and the detection pads 12 to 15 (solder application step, Step S2). In the solder application step, a metal mask having opening portions in regions to be coated with solder is placed on the board 10. The solder paste H is applied from above the metal mask. The solder paste H applied onto the metal mask is spread uniformly by use of a given tool such as a squeegee. Thus, the solder paste H is applied through the opening portions.

Figure 6C:
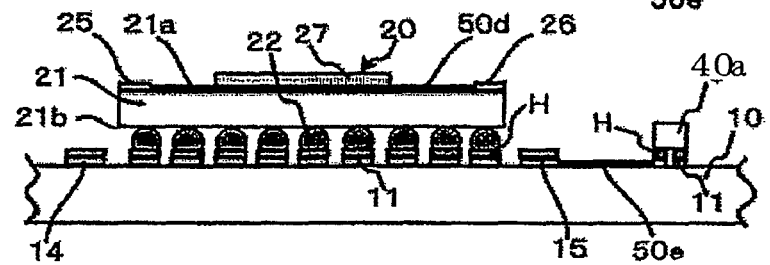

Next, as shown in FIG. 6C, the semiconductor package 20 provided with detection pads 23 to 26 and conductors 50b and 50d and the determination circuit 40a are mounted on the board 10 (mounting step, Step S3). For example, an upper face 21a of the semiconductor package 20 is sucked by a mounting machine such as a mounter. The semiconductor package 20 is moved to a position where solder balls 22 face the pads 11 on the board 10. Thus, the semiconductor package 20 is mounted from above the board 10 by the mounter. The determination circuit 40a is mounted in the position of a given pad 11 of the board 10 by the mounter or the like.

Figure 6D:
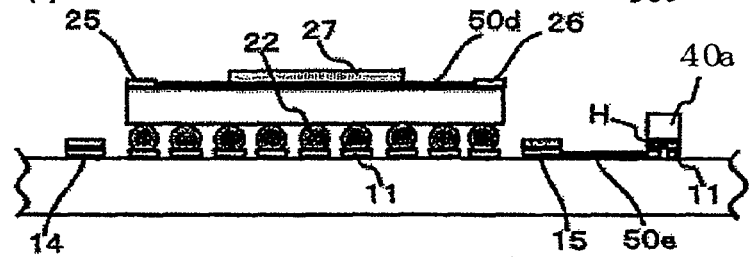

Next, as shown in FIG. 6D, the board 10 mounted with the semiconductor package 20 and the determination circuit 40a is heated and bonded by soldering (first heating step, Step S4). In this heating step, heating treatment with a given temperature profile is performed, for example, by use of a reflow furnace. The solder paste H and the solder balls 22 are integrated so that semiconductor package 20 is mounted on the board 10. The determination circuit 40a is mounted on the board 10 by the solder paste H.

Figure 6E:
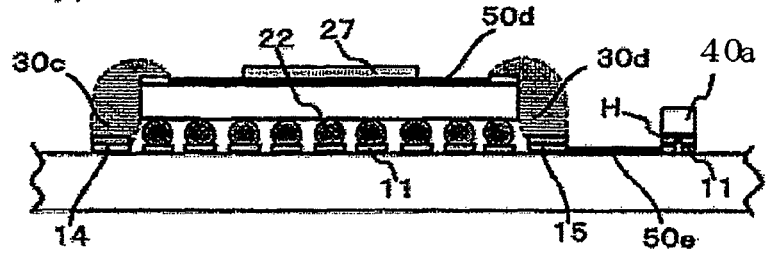

Next, as shown in FIG. 6E, conductive bonding portions 30a to 30d are applied to bond the detection pads 23 to 26 provided on the upper face 21a of the package body 21 with the pads 12 to 15 provided on a first face 10a of the board 10, respectively (conductive bonding portion application step, Step S5).

Figure 6F:
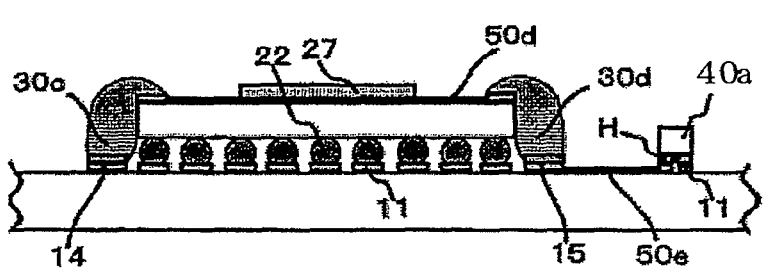

Next, as shown in FIG. 6F, the board 10 is heated to harden the conductive bonding portions 30a to 30d (second heating step, Step S6).

Through the aforementioned Steps S1 to S6, the printed circuit board 7 according to the first embodiment can be obtained.

According to the first embodiment, as described above, it is possible to determine whether the conductive bonding portions 30a to 30d bonding the board 10 with the semiconductor package 20 have been separated or not. That is, the detection pads 12 to 15 on the board 10 are bonded to the detection pads 23 to 26 on the upper face 21a of the package body 21 through the conductive bonding portions 30a to 30d respectively. Further, the board 10 and the upper face 21a of the package body 21 are connected through the conductors 50 alternately. The opposite ends of the connected circuit are connected to the determination circuit 40a. A detection signal supplied from the determination circuit 40a to the connected circuit is compared with a detection signal received through the connected circuit. Based on a difference between the detection signals, the separation of the conductive bonding portions 30a to 30d can be determined by the determination circuit 40a. When the separation of the conductive bonding portions 30a to 30d bonding the board 10 with the semiconductor package 20 is detected, the user can be notified of the necessity of maintenance before connection failure appears in the solder balls 22 of the semiconductor package 20.

Figure 7A:
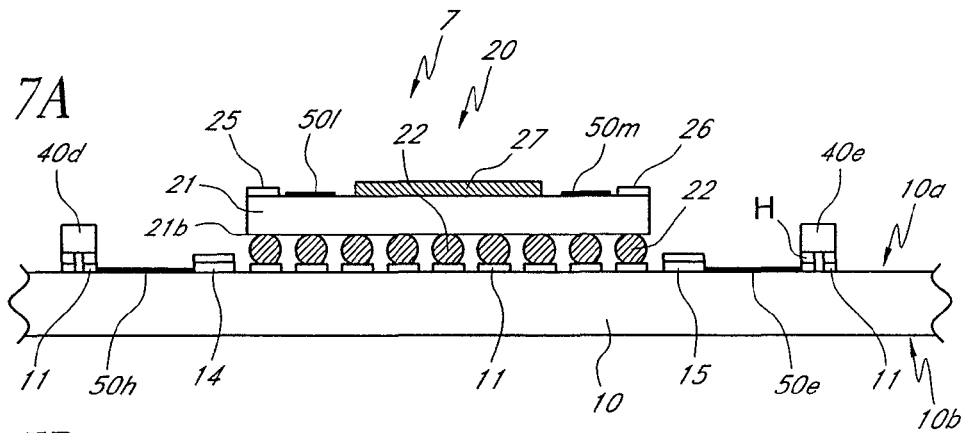
FIGS. 7A to 7C are exemplary schematic views of a printed circuit board according to a second embodiment of the invention.
Figure 7B:
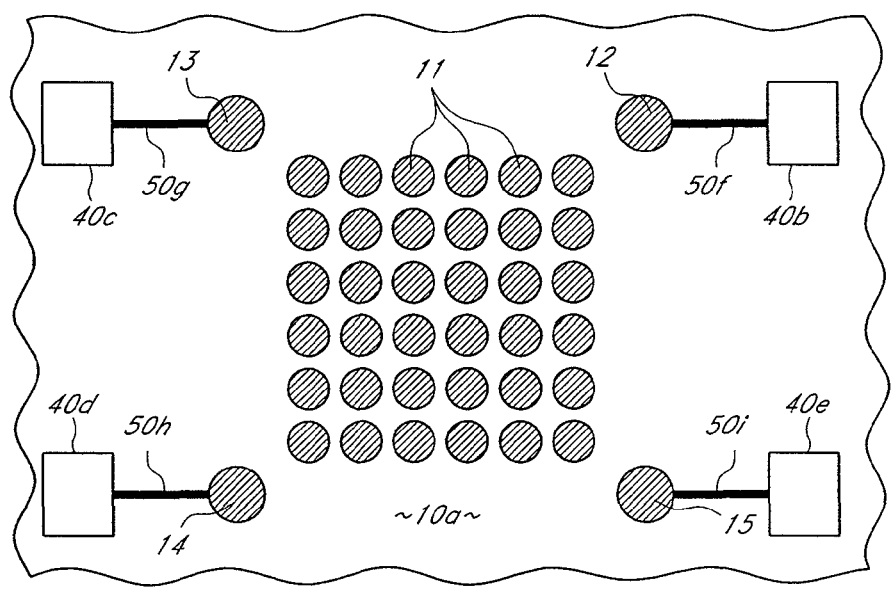
Figure 7C:
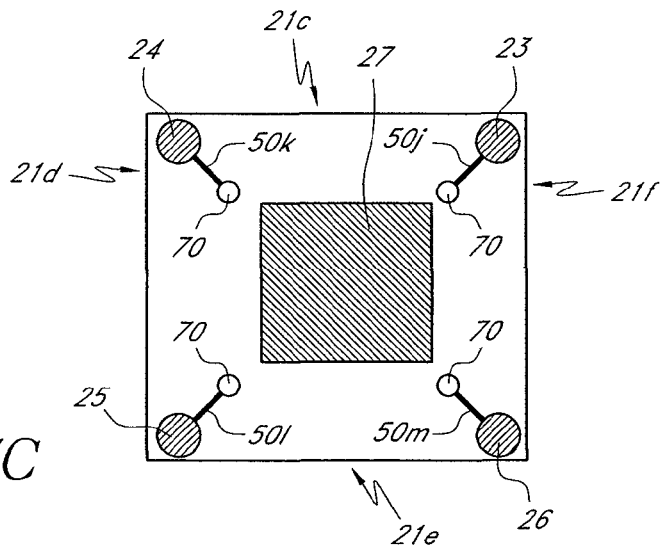
Figure 8A:
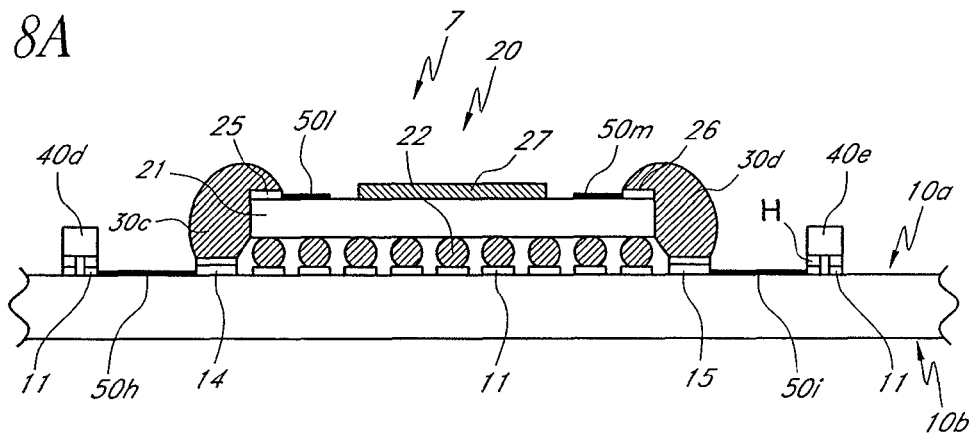
FIGS. 8A and 8B are exemplary schematic views of the printed circuit board according to the second embodiment of the invention, to which conductive bonding portions have been applied.
Figure 8B:
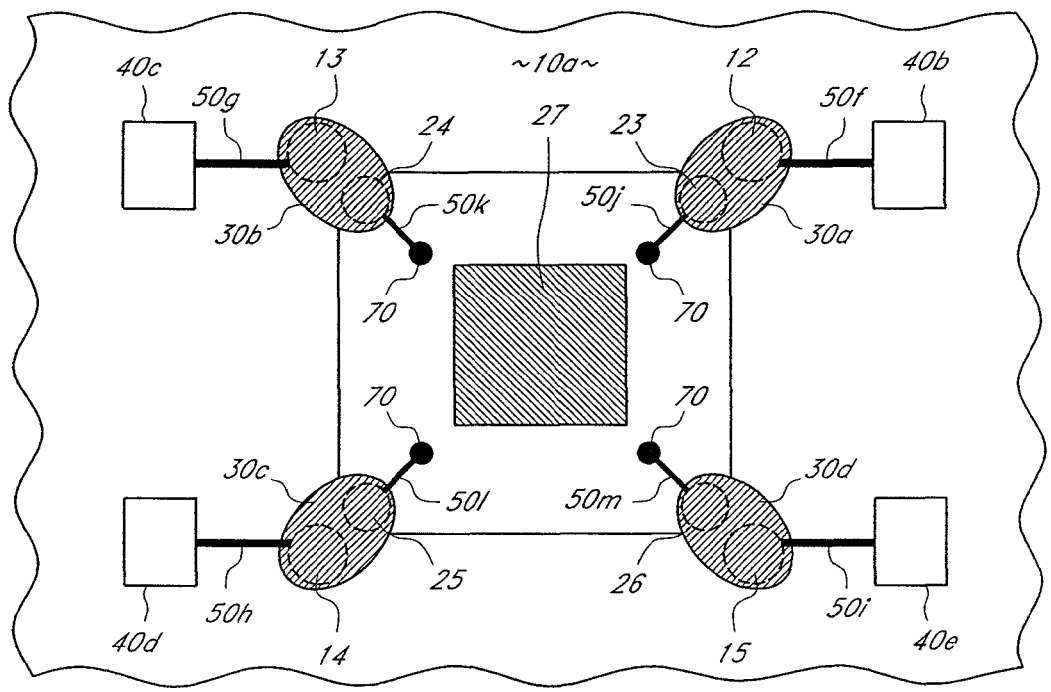

Next, a second embodiment will be described with reference to FIGS. 7A to 10B. First, the structure of a printed circuit board 7 will be described with reference to FIGS. 7A to 7C and FIGS. 8A and 8B. FIGS. 7A to 7C are schematic views of the printed circuit board 7 according to the second embodiment of the invention. FIG. 7A is a sectional view of the printed circuit board 7. FIG. 7B is a top view of a board 10. FIG. 7C is a top view of a semiconductor package 20. FIGS. 8A and 8B are schematic views of the printed circuit board 7 according to the second embodiment of the invention, to which conductive bonding portions 30a to 30d have been applied. FIG. 8A is a sectional view of the printed circuit board 7 to which the conductive bonding portions 30a to 30d have been applied. FIG. 8B is a top view of the printed circuit board 7 to which the conductive bonding portions 30a to 30d have been applied.

First, the structure of the printed circuit board 7 to which the conductive bonding portions 30a to 30d have not yet been applied will be described. As shown in FIG. 7A, the printed circuit board 7 has a board 10, a semiconductor package 20, determination circuits 40b to 40e and conductors 50f to 50m. The second embodiment is different from the first embodiment in that the determination circuits 40b to 40e are connected to detection pads 12 to 15 in the corner portions through the conductors 50f to 50i respectively. In addition, detection pads 23 to 26 are connected to a ground electrode 70 through the conductors 50j to 50m respectively.

As shown in FIG. 7B, the conductor 50f connects the determination circuit 40b with the detection pad 12, the conductor 50g connects the determination circuit 40c with the detection pad 13, the conductor 50h connects the determination circuit 40d with the detection pad 14, and the conductor 50i connects the determination circuit 40e with the detection pad 15. In addition, as shown in FIG. 7C, the conductor 50j fixes the detection pad 23 to the ground electrode 70, the conductor 50k fixes the detection pad 24 to the ground electrode 70, the conductor 50l fixes the detection pad 25 to the ground electrode 70, and the conductor 50m fixes the detection pad 26 to the ground electrode 70.

Next, the structure of the printed circuit board 7 to which the conductive bonding portions 30a to 30d have been applied will be described with reference to FIGS. 8A and 8B. In the same manner as in the first embodiment, the conductive bonding portion 30a bonds the detection pad 12 and the detection pad 23, the conductive bonding portion 30b bonds the detection pad 13 and the detection pad 24, the conductive bonding portion 30c bonds the detection pad 14 and the detection pad 25, and the conductive bonding portion 30d bonds the detection pad 15 and the detection pad 26.

Figure 9:
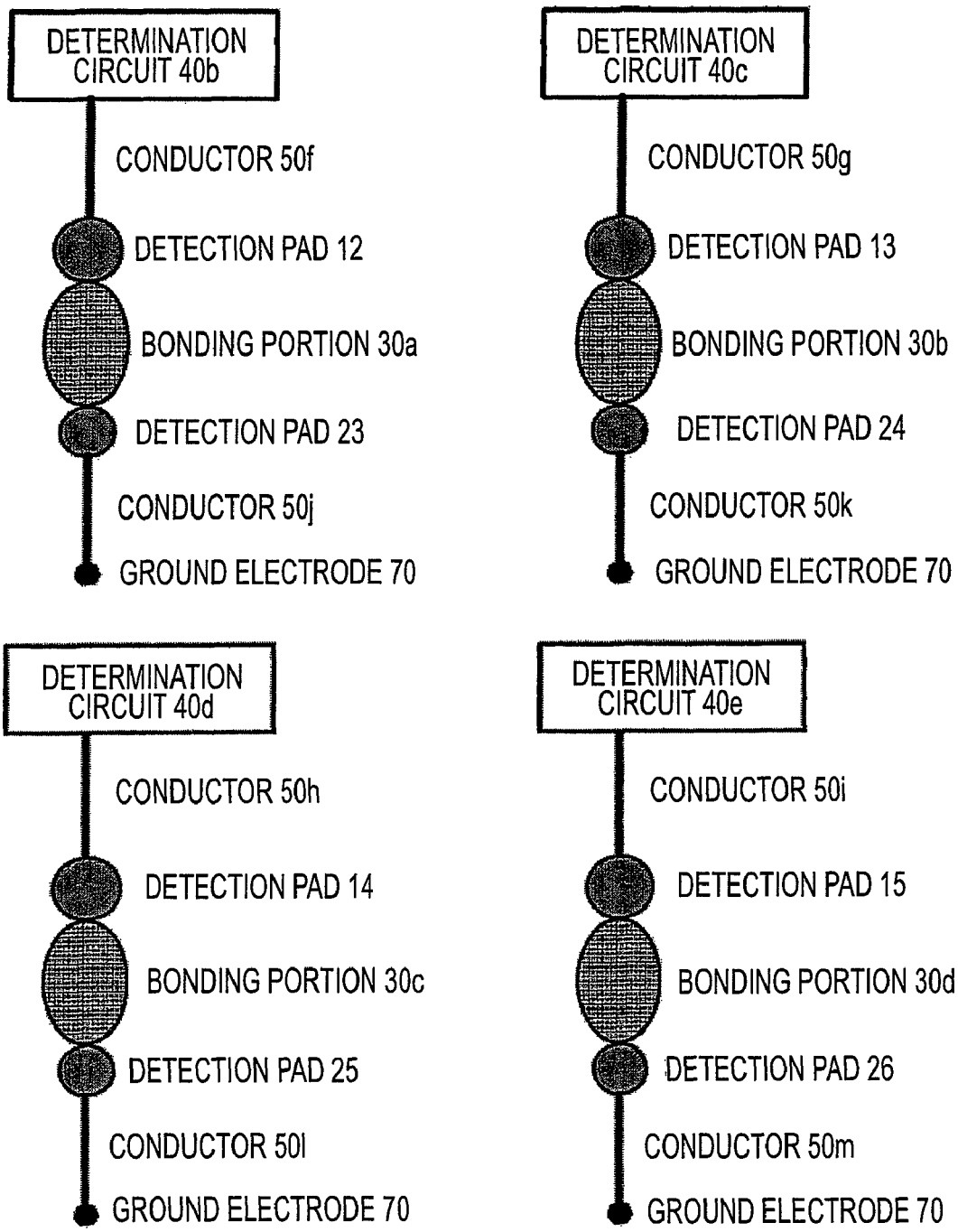
FIG. 9 is an exemplary conceptual view of connection of the printed circuit board according to the second embodiment of the invention.

The connection relationship in the printed circuit board 7 configured as described above will be described with reference to FIG. 9. FIG. 9 is a conceptual view of the connection of the printed circuit board 7 according to the second embodiment of the invention.

The determination circuit 40b, the detection pad 12, the conductive bonding portion 30a and the detection pad 23 are connected in turn and fixed to the ground electrode 70. The determination circuit 40c, the detection pad 13, the conductive bonding portion 30b and the detection pad 24 are connected in turn and fixed to the ground electrode 70. The determination circuit 40d, the detection pad 14, the conductive bonding portion 30c and the detection pad 25 are connected in turn and fixed to the ground electrode 70. The determination circuit 40e, the detection pad 15, the conductive bonding portion 30d and the detection pad 26 are connected in turn and fixed to the ground electrode 70.

Figure 10A:
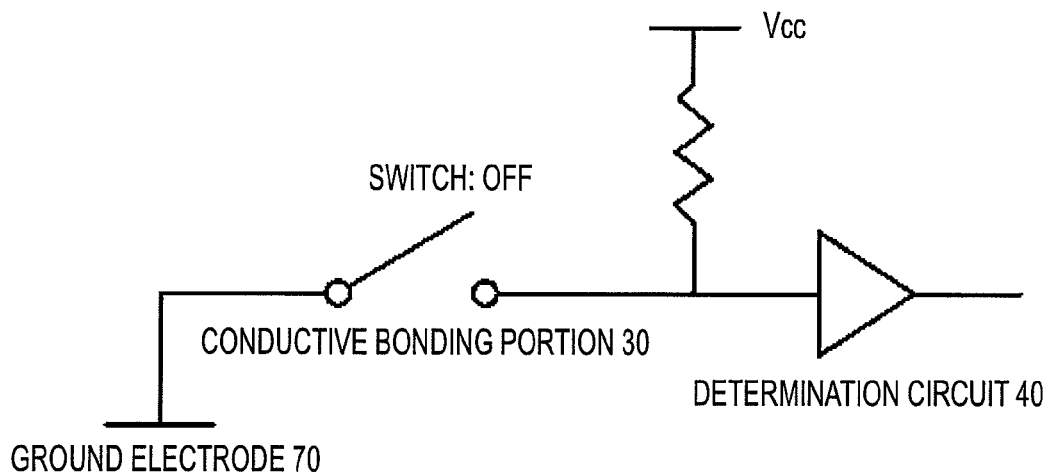
FIGS. 10A and 10B are exemplary schematic diagrams showing a determination circuit according to the second embodiment of the invention by way of example.
Figure 10B:
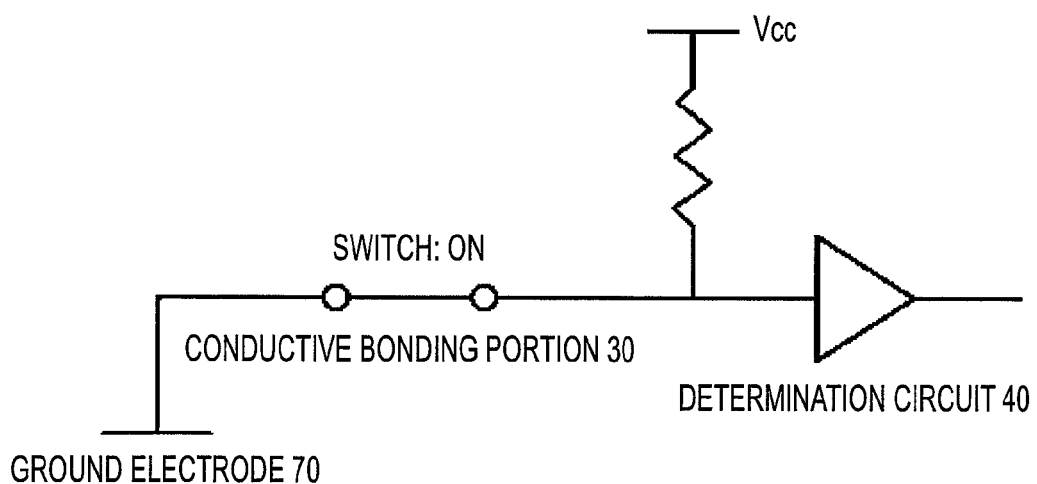

The determination circuits 40b to 40e according to the second embodiment will be described with reference to FIGS. 10A and 10B. FIGS. 10A and 10B are schematic diagrams showing each determination circuits 40b to 40e according to the second embodiment of the invention by way of example. In FIGS. 10A and 10B, each determination circuits 40b to 40e corresponds to a logic circuit, and each conductive bonding portions 30a to 30d corresponds to a switch. FIG. 10A shows an OFF state of the switch, that is, the case where the conductive bonding portions 30a to 30d is separated from either the detection pads 12 to 15 or the detection pads 23 to 26. In this case, the determination circuits 40b to 40e detect a power supply voltage (Vcc). FIG. 10B shows an ON state of the switch, that is, the case where the conductive bonding portions 30a to 30d are bonded with the detection pads 12 to 15 and the detection pads 23 to 26. In this case, the determination circuits 40b to 40e detect a voltage corresponding to the ground potential. Accordingly, when a voltage other than the ground potential is detected by any of the determination circuits 40b to 40e, it can be seen that any of the conductive bonding portions 30a to 30d corresponding to the determination circuits 40b to 40e is separated.

A method for manufacturing the printed circuit board 7 according to the second embodiment is similar to the method for manufacturing the printed circuit board 7 according to the first embodiment. Thus, the description of the method will be omitted.

According to the second embodiment, in the aforementioned configuration, the determination circuits 40b to 40e are provided for the conductive bonding portions 30a to 30d at the four corners of the semiconductor package 20 respectively. It is therefore unnecessary to connect the board 10 and the upper face 21a of the package body 21 alternately as in the first embodiment. In addition, it can be known which conductive bonding portion 30a to 30d has been separated. It is therefore unnecessary to perform visual examination at the time of maintenance. The maintainability can be improved.

Figure 12A:
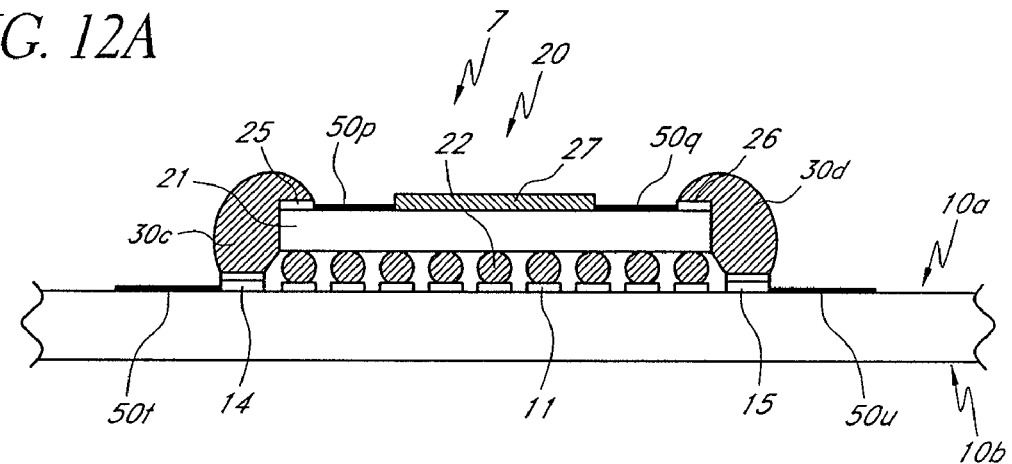
FIGS. 12A and 12B are exemplary schematic views of the printed circuit board according to the third embodiment of the invention, to which conductive bonding portions have been applied.
Figure 12B:
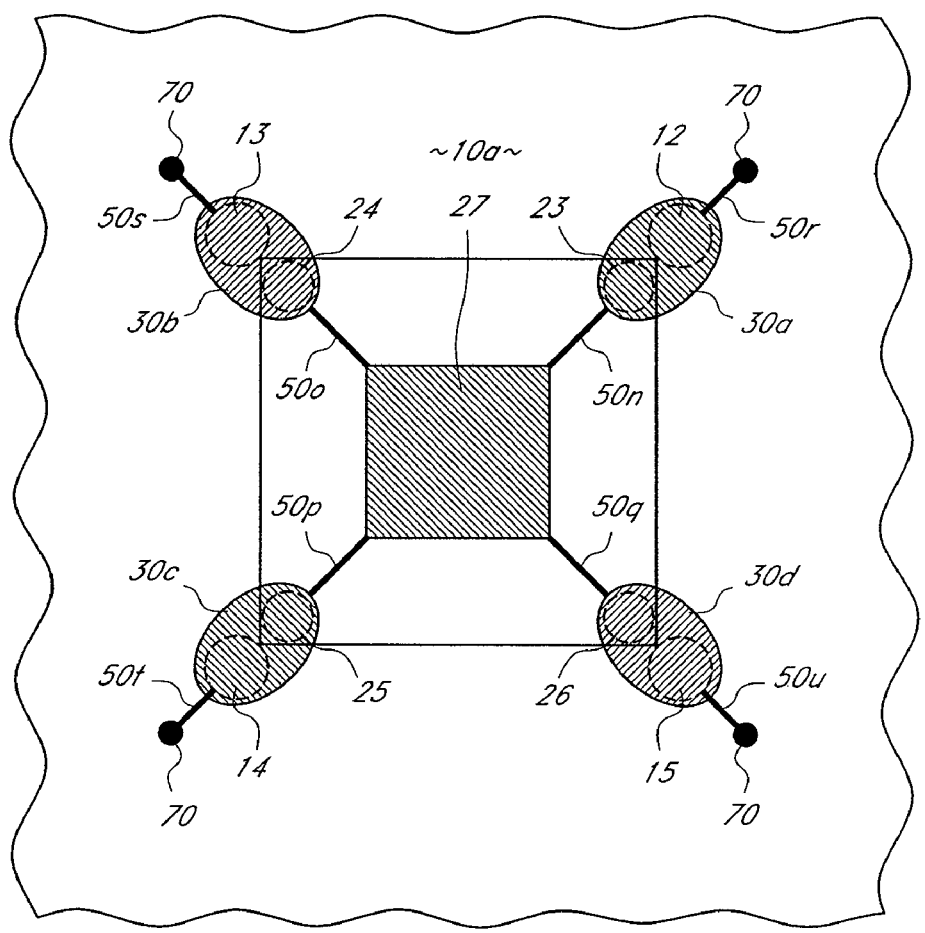

Next, a third embodiment will be described with reference to FIGS. 11A to 13. First, the structure of a printed circuit board 7 will be described with reference to FIGS. 11A to 11C and FIGS. 12A and 12B. FIGS. 11A to 11C are schematic views of the printed circuit board 7 according to the third embodiment of the invention. FIG. 11A is a sectional view of the printed circuit board 7. FIG. 11B is a top view of a board 10. FIG. 11C is a top view of a semiconductor package 20. FIGS. 12A and 12B are schematic views of the printed circuit board 7 according to the third embodiment of the invention, to which conductive bonding portions 30a to 30d have been applied. FIG. 12A is a sectional view of the printed circuit board 7 to which the conductive bonding portions 30a to 30d have been applied. FIG. 12B is a top view of the printed circuit board 7 to which the conductive bonding portions 30a to 30d have been applied.

First, the structure of the printed circuit board 7 to which the conductive bonding portions 30a to 30d have not yet been applied will be described. As shown in FIG. 11A, the printed circuit board 7 has a board 10, a package body 21, a chip 28 having a determination function, and conductors 50n to 50u. The third embodiment is different from the second embodiment in that the chip 28 having a determination function is used, and detection pads 12 to 15 on a first face 10a of the board 10 are connected to a ground electrode 70.

As shown in FIG. 11B, the conductor 50r connects the detection pad 12 with the ground electrode 70, the conductor 50s connects the detection pad 13 with the ground electrode 70, the conductor 50t connects the detection pad 14 with the ground electrode 70, and the conductor 50u connects the detection pad 15 with the ground electrode 70.

As shown in FIG. 11C, the conductors 50n to 50q respectively connect the detection pads 23 to 26 with the chip 28 having a determination function.

Next, the structure of the printed circuit board 7 to which the conductive bonding portions 30a to 30d have been applied will be described with reference to FIGS. 12A and 12B. In the same manner as in the second embodiment, the conductive bonding portion 30a bonds the detection pad 12 and the detection pad 23, the conductive bonding portion 30b bonds the detection pad 13 and the detection pad 24, the conductive bonding portion 30c bonds the detection pad 14 and the detection pad 25, and the conductive bonding portion 30d bonds the detection pad 15 and the detection pad 26.

Figure 13:
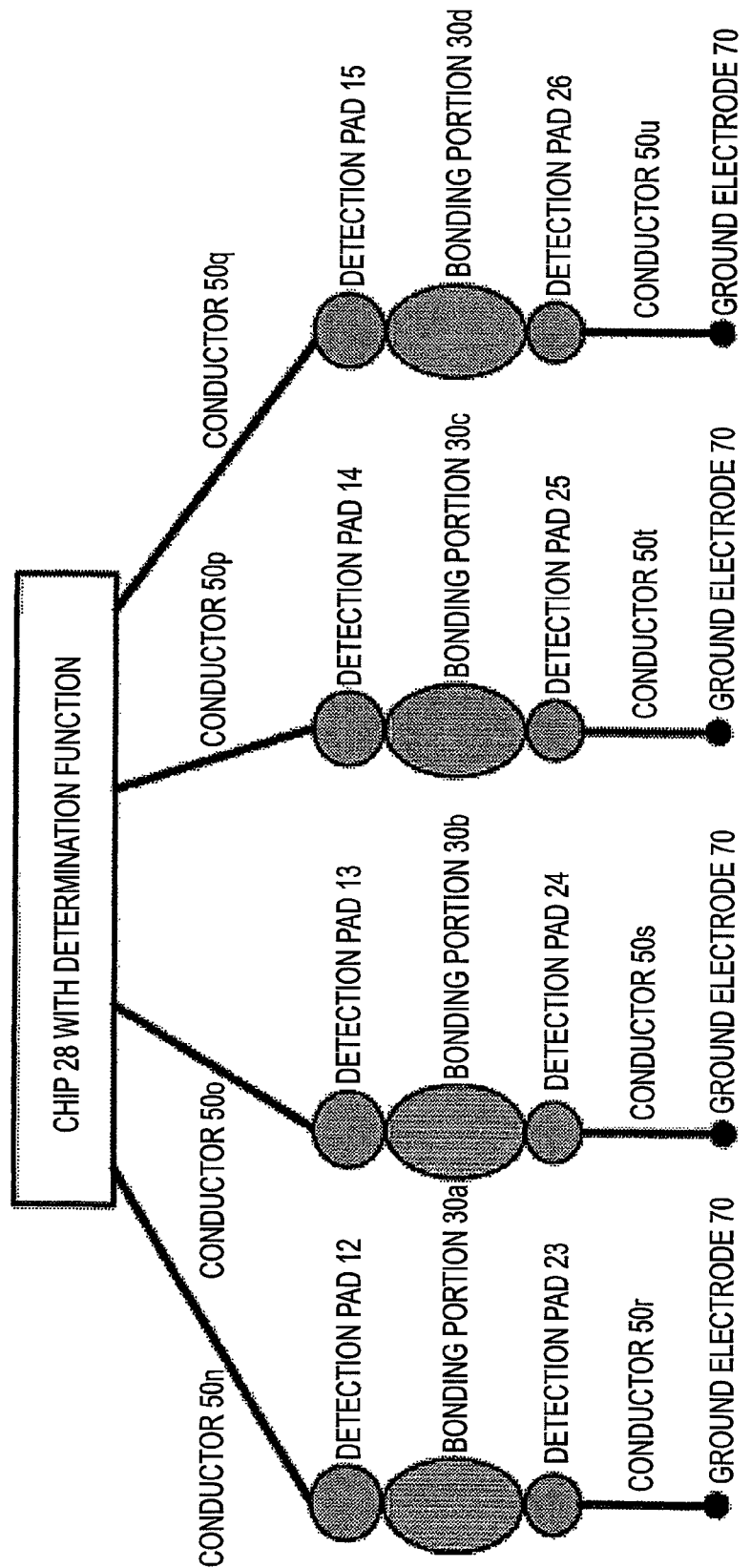
FIG. 13 is an exemplary conceptual view of connection of the printed circuit board according to the third embodiment of the invention.

The connection relationship in the printed circuit board 7 configured as described above will be described with reference to FIG. 13. FIG. 13 is a conceptual view of the connection of the printed circuit board 7 according to the third embodiment of the invention. The chip 28 having a determination function, the detection pad 12, the conductive bonding portion 30a and the detection pad 23 are connected in turn and connected to the ground electrode 70. The chip 28 having a determination function, the detection pad 13, the conductive bonding portion 30b and the detection pad 24 are connected in turn and connected to the ground electrode 70. The chip 28 having a determination function, the detection pad 14, the conductive bonding portion 30c and the detection pad 25 are connected in turn and connected to the ground electrode 70. The chip 28 having a determination function, the detection pad 15, the conductive bonding portion 30d and the detection pad 26 are connected in turn and connected to the ground electrode 70.

In the same manner as in the second embodiment, each conductive bonding portion 30a to 30d corresponds to a switch. In an OFF state of the switch, that is, in the case where any of the conductive bonding portions 30a to 30d is separated from either the detection pads 12 to 15 or the detection pads 23 to 26, the chip 28 having a determination function detects a power supply voltage (Vcc). On the contrary, in an ON state of the switch, that is, in the case where the conductive bonding portions 30a to 30d are bonded, the chip 28 having a determination function detects a voltage corresponding to the ground potential.

A method for manufacturing the printed circuit board 7 according to the third embodiment is similar to the method for manufacturing the printed circuit board 7 according to the first embodiment. Thus, the description of the method will be omitted.

According to the third embodiment, in the aforementioned configuration, the determination function is provided in the chip so that it is unnecessary to provide a determination circuit component separately. That is, separation of any one of the conductive bonding portions 30a to 30d can be determined without increasing the number of components. That is, it is possible to inform the user of the necessity of maintenance before connection failure appears in the solder balls 22 of the semiconductor package 20.

Next, a fourth embodiment of the invention will be described with reference to FIGS. 14A to 14H. FIGS. 14A to 14H are views showing a method for manufacturing a printed circuit board 7 according to the fourth embodiment of the invention. In the method for manufacturing the printed circuit board 7 according to the fourth embodiment, Steps S1 to S4 (FIGS. 14A to 14D) are similar to Steps S1 to S4 (FIGS. 6A to 6D) in the first method for manufacturing a printed circuit board 7. Thus, description thereof will be omitted. In the specification, the fourth embodiment will be described along the printed circuit board 7 according to the first embodiment. It will have no difference when the printed circuit board 7 according to the second or third embodiment is used.

Figure 14A:
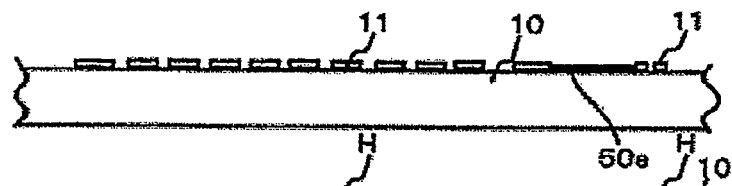
FIGS. 14A to 14H are exemplary views showing a method for manufacturing a printed circuit board according to a fourth embodiment of the invention.
Figure 14B:
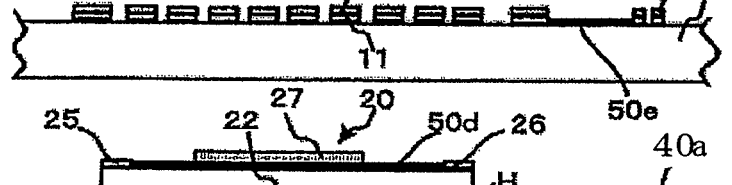
Figure 14C:
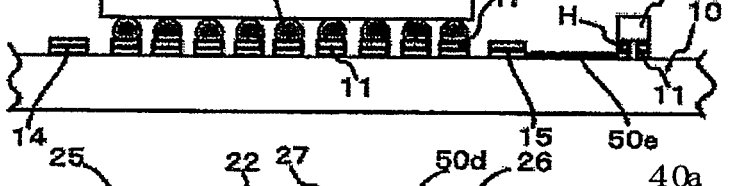
Figure 14D:
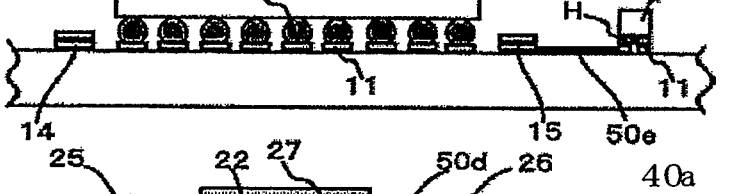
Figure 14E:
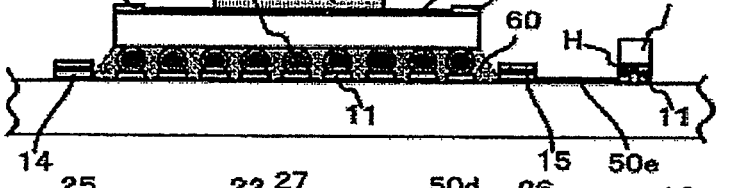

Next, as shown in FIG. 14E, a nonconductive bonding portion 60 is filled into a region where the solder balls 22 are absent between the lower face 21b of the package body 21 and the first face 10a of the board 10 (nonconductive bonding portion charging step, Step S5).

Figure 14F:
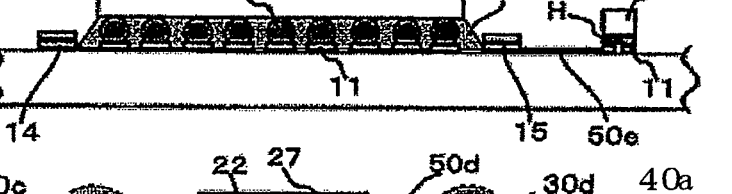

Next, as shown in FIG. 14F, the board 10 is heated to harden the nonconductive bonding portion 60 (second heating step, Step S6).

Figure 14G:
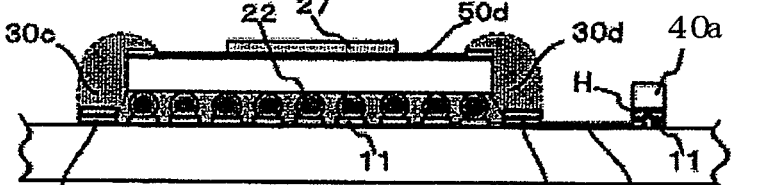

Next, as shown in FIG. 14G, the conductive bonding portions 30a to 30d are applied to bond the detection pads 23 to 26 provided on the upper face 21a of the package body 21 with the pads 12 to 15 provided on the first face 10a of the board 10, respectively (conductive bonding portion application step, Step S7).

Figure 14H:
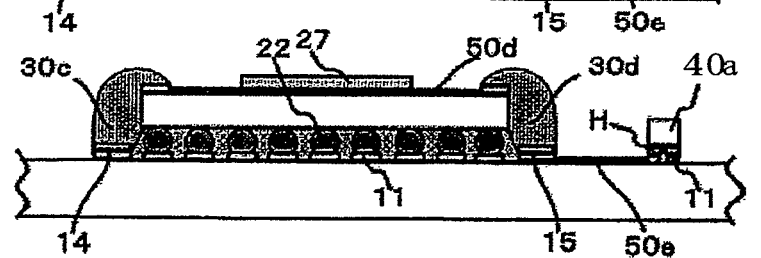

Next, as shown in FIG. 14H, the board 10 is heated to harden the conductive bonding portions 30a to 30d (third heating step, Step S8).

Through the aforementioned Steps S1 to S8, the printed circuit board 7 according to the fourth embodiment can be obtained. In the printed circuit board 7 according to the fourth embodiment, the nonconductive bonding portion 60 is used so that the package body 21 and the board 10 can be bonded more firmly. In addition, the toughness of the printed circuit board 7 can be also improved. When the detection pads 12 to 15, the detection pads 23 to 26, the conductive bonding portions 30a to 30d and the determination circuit 40a are connected, the separation of the conductive bonding portions 30a to 30d can be found out. Accordingly, in the same manner as in the first, second and third embodiments, the user can be notified of the necessity of maintenance before connection failure appears in the solder balls 22 of the semiconductor package 20.

The invention is not limited to the aforementioned embodiments per se and constituent members may be modified to embody the invention in practical use without departing from the point of the invention. Constituent members disclosed in the embodiments may be combined suitably to form various inventions. For example, several constituent members may be removed from all the constituent members described in each of the embodiments. In addition, constituent members in different embodiments may be combined suitably.

What is claimed is:

1. An electronic apparatus, comprising:
a housing; and
a printed circuit board housed in the housing,
wherein the printed circuit board includes:
    a semiconductor package having a substantially rectangular parallelepiped body, a first face, and a second face positioned opposite to the first face;
    a board arranged to face the first face, the board having a mount region corresponding to the first face;
    a plurality of solder balls provided on the board so that upper portions thereof contact the first face of the semiconductor package;
    a first electrode provided at a first corner on an outer circumference of the second face, a second electrode provided at a second corner, a third electrode provided at a third corner positioned diagonally with respect to the first corner and a fourth electrode provided at a fourth corner positioned diagonally with respect to the second corner;
    fifth, sixth, seventh and eighth electrodes provided on an outer circumference of the mount region correspondingly with the first to fourth electrodes, respectively;
    a first conductor mounted on the second face to connect the first electrode with the second electrode;
    a second conductor mounted on the second face to connect the third electrode with the fourth electrode;
    a third conductor mounted on the outer circumference of the mount region to connect the sixth electrode with the seventh electrode;
    a pair of fourth conductors mounted on the outer circumference of the mount region so that one of the fourth conductors is connected to the fifth electrode while the other of the fourth conductors is connected to the eighth electrode;
    conductive bonding portions applied to the four corners on the semiconductor package to bond the electrodes on the second face with the corresponding electrodes on the mount region, respectively; and
    a determination module connected to the pair of fourth conductors and configured to determine whether or not there is a difference between a value of a current to the one of the fourth conductors and a value of a current from the other one of the fourth conductors.

2. The apparatus of claim 1, further comprising:
a nonconductive bonding portion filled into a gap between the mount region and the first face to bond the semiconductor package with the board.

3. An electronic apparatus, comprising:
a housing; and
a printed circuit board housed in the housing,
wherein the printed circuit board includes:
    a semiconductor package having a substantially rectangular parallelepiped body having a first face;
    a plurality of first electrodes provided at four corners on a second face being opposite to the first face of the semiconductor package;
    a first conductor provided to bond the first electrodes positioned on a first line of the second face of the semiconductor package;
    a second conductor provided to bond the first electrodes positioned on a second line, the second line being positioned in parallel with the first line of the second face of the semiconductor package;
    a board arranged to face the first face, the board having a planar mount region corresponding to the first face;
    a plurality of solder balls provided on the board so that upper portions thereof contact the first face of the body;
    a plurality of second electrodes provided at four corners on an outer circumference of the mount region;
    a third conductor provided on the mount region to bond the second electrodes positioned on a third line, the third line corresponding to a line perpendicular to the first line of the second face of the semiconductor package being mounted on the mount region;
    a pair of fourth conductors provided to bond the second electrodes positioned on a fourth line of the mount region, the fourth line being positioned in parallel with the third line;
    conductive bonding portions applied to the four corners on the semiconductor package being mounted on the mount region to bond the first electrodes on the second face with the closest second electrodes on the mount region among the second electrodes, respectively; and a determination module connected to the pair of fourth conductors and configured to determine whether or not there is a difference between a value of a current to the one of the fourth conductors and a value of a current from the other one of the fourth conductors.

4. The apparatus of claim 3, further comprising:
a nonconductive bonding portion filled into a gap between the mount region and the first face to bond the semiconductor package with the board.

5. An electronic apparatus, comprising:
a housing; and
a printed circuit board housed in the housing, wherein the printed circuit board includes:
  a semiconductor package having a substantially rectangular parallelepiped body having a first face;
  a board arranged to face the first face, the board having a planar mount region corresponding to the first face;
  a plurality of solder balls provided on the board so that upper portions thereof contact the first face of the body;
  a plurality of first electrodes provided at four corners on a second face being opposite to the first face of the semiconductor package;
  a plurality of second electrodes provided at four corners on an outer circumference of the mount region;
  a plurality of first conductors provided on the second face to connect the first electrodes with a ground electrode;
  a plurality of second conductors provided outside the mount region to be connected to the second electrodes, respectively;
  conductive bonding portions applied to the four corners on the semiconductor package being mounted on the mount region to bond the first electrodes on the second face with the closest second electrodes on the mount region among second electrodes, respectively; and
  a determination module provided around the second electrodes and configured to determine whether or not a ground potential is detected.

6. The apparatus of claim 5, further comprising: a nonconductive bonding portion filled into a gap between the mount region and the first face to bond the semiconductor package with the board.

7. A printed circuit board, comprising:
a semiconductor package having a substantially rectangular parallelepiped body, a first face, and a second face positioned opposite to the first face;
a board arranged to face the first face, the board having a mount region corresponding to the first face;
a plurality of solder balls provided on the board so that upper portions thereof contact the first face of the semiconductor package;
a first electrode provided at a first corner on an outer circumference of the second face, a second electrode provided at a second corner, a third electrode provided at a third corner positioned diagonally with respect to the first corner, and a fourth electrode provided on a fourth corner positioned diagonally with respect to the second corner;
fifth, sixth, seventh and eighth electrodes provided on an outer circumference of the mount region correspondingly with the first to fourth electrodes, respectively;

a first conductor mounted on the second face to connect the first electrode with the second electrode;
a second conductor mounted on the second face to connect the third electrode with the fourth electrode;
a third conductor mounted on the outer circumference of the mount region to connect the sixth electrode with the seventh electrode;
a pair of fourth conductors mounted on the outer circumference of the mount region so that one of the fourth conductors is connected to the fifth electrode while the other of the fourth conductors is connected to the eighth electrode;
conductive bonding portions applied to the four corners on the semiconductor package to bond the electrodes on the second face with the corresponding electrodes on the mount region, respectively; and
a determination module connected to the pair of fourth conductors and configured to determine whether or not there is a difference between a value of a current to the one of the fourth conductors and a value of a current from the other one of the fourth conductors.

8. A printed circuit board, comprising:
a semiconductor package having a substantially rectangular parallelepiped body having a first face;
a plurality of first electrodes provided at four corners on a second face being opposite to the first face of the semiconductor package;
a first conductor provided to bond the first electrodes positioned on a first line of the second face of the semiconductor package;
a second conductor provided to bond the first electrodes positioned on a second line, the second line being positioned in parallel with the first line of the second face of the semiconductor package;
a board arranged to face the first face, the board having a planar mount region corresponding to the first face;
a plurality of solder balls provided on the board so that upper portions thereof contact the first face of the body;
a plurality of second electrodes provided at four corners on an outer circumference of the mount region;
a third conductor provided on the mount region to bond the second electrodes positioned on a third line, the third line corresponding to a line perpendicular to the first line of the second face of the semiconductor package being mounted on the mount region;
a pair of fourth conductors provided to bond the second electrodes positioned on a fourth line of the mount region, the fourth line being positioned in parallel with the third line;
conductive bonding portions applied to the four corners on the semiconductor package being mounted on the mount region to bond the first electrodes on the second face with the closest second electrodes on the mount region among the second electrodes, respectively; and
a determination module connected to the pair of fourth conductors and configured to determine whether or not there is a difference between a value of a current to the one of the fourth conductors and a value of a current from the other one of the fourth conductors.

9. A printed circuit board, comprising:
a semiconductor package having a substantially rectangular parallelepiped body having a first face;
a board arranged to face the first face, the board having a planar mount region corresponding to the first face;
a plurality of solder balls provided on the board so that upper portions thereof contact the first face of the body;

a plurality of first electrodes provided at four corners on a second face being opposite to the first face of the semiconductor package;

a plurality of second electrodes provided at four corners on an outer circumference of the mount region;

a plurality of first conductors provided on the second face to connect the first electrodes with a ground electrode;

a plurality of second conductors provided outside the mount region to be connected to the second electrodes, respectively;

conductive bonding portions applied to the four corners on the semiconductor package being mounted on the mount region to bond the first electrodes on the second face with the closest second electrodes on the mount region among the second electrodes, respectively; and a determination module provided around the second electrodes and configured to determine whether or not a ground potential is detected.

* * * * *